(12) United States Patent
Wang et al.

(10) Patent No.: US 10,386,715 B2
(45) Date of Patent: Aug. 20, 2019

(54) METHODOLOGY FOR POST-INTEGRATION AWARENESS IN OPTICAL PROXIMITY CORRECTION

(71) Applicant: GLOBALFOUNDRIES INC., Grand Cayman (KY)

(72) Inventors: Feng Wang, Clifton Park, NY (US); Hongxin Zhang, Clifton Park, NY (US); Shaowen Gao, Clifton Park, NY (US); Norman Chen, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/730,830

(22) Filed: Oct. 12, 2017

(65) Prior Publication Data

US 2019/0113837 A1  Apr. 18, 2019

(51) Int. Cl.
*G03F 1/36* (2012.01)
(52) U.S. Cl.
CPC ..................... *G03F 1/36* (2013.01)

(58) Field of Classification Search
USPC .......................................... 716/53
See application file for complete search history.

(56) References Cited

U.S. PATENT DOCUMENTS

| 9,064,084 B2 | 6/2015 | Katakamsetty et al. |
| 2014/0121799 A1* | 5/2014 | Liu .................. G01B 15/00 700/97 |
| 2014/0282288 A1* | 9/2014 | Dai .................. G06F 17/5009 716/51 |

* cited by examiner

*Primary Examiner* — Eric D Lee
(74) *Attorney, Agent, or Firm* — David Cain; Hoffman Warnick LLC

(57) ABSTRACT

A method of creating an optical proximity correction (OPC) model and assessing the model through optical rule checking (ORC) includes the introduction of post-integration, i.e., post-metallization data. High density critical dimension scanning electron microscopy and backscattered electron scanning electron microscopy from a metallized structure are used during development and verification of the model to accurately predict post-integration behavior.

15 Claims, 3 Drawing Sheets

METHODOLOGY FOR POST-INTEGRATION AWARENESS IN OPTICAL PROXIMITY CORRECTION

BACKGROUND

The present application relates generally to semiconductor device manufacture, and more specifically to an optical proximity correction (OPC) method for forming a lithography mask and a related semiconductor structure.

Advances in integrated circuit (IC) materials and design have yielded generations of ICs where successive generations have smaller and more complex circuits. As ICs evolve, the functional density (i.e., the number of interconnected devices per unit area) has generally increased and the critical dimension (i.e., the minimum feature size) has decreased. While dimensional scaling improves performance, increases production efficiency, and lowers costs, it has also increased the complexity of processing and manufacturing.

SUMMARY

Notwithstanding recent developments, there is a need for improved methods of semiconductor device manufacture and feature patterning. The present application relates to an optical proximity correction (OPC) method of preparing data for forming a mask for use in defining semiconductor device structures such as metallized trenches and vias.

Metallization processes, including the formation of contact vias and trenches, are ubiquitous in semiconductor technology patterning for advanced technology nodes. A characteristic of such processes is that a metallization structure can have near vertical sidewalls proximate to an adjacent metal layer, which beneficially impacts scaling and allows for compact designs. However, sidewalls that are sloped or that are placed at less than a critical distance from an adjacent structure can create yield and reliability concerns in addition to the requirement for additional design space in non-self-aligned directions.

As disclosed herein, a model-based approach is used to avoid encroachment of non-self-aligned edges upon lower metal layers while avoiding an intolerable real estate penalty. Specifically, an additional constraint is introduced to the optical proximity correction (OPC) methodology to develop and evaluate the OPC model, and avoid locating an outer via (or trench) contour within a critical distance from a lower or laterally adjacent conductive structure.

In accordance with embodiments of the present application, integration process effects are incorporated into the creation and verification of OPC using optical rule checking (ORC) to detect and avoid incidences of interlayer failure. High-resolution critical dimension scanning electron microscopy and backscattered electron scanning electron microscopy data are used to measure and evaluate post-integration, i.e., post-metallization structures. Compared to conventional methodologies, the disclosed OPC/ORC methodology decreases the risk of via-to-metal line bridging and bridging/pinching of metal line itself, and improves device performance and reliability.

A method of verifying an optical proximity correction (OPC) rule set includes collecting critical dimension scanning electron microscope (CDSEM) data from a post-integration structure, constructing a post-integration OPC model using the post-integration CDSEM data, performing optical rule checking (ORC) on the optical proximity correction (OPC) rule set using the post-integration OPC model to identify post-integration weak points, and verifying the post-integration weak points.

A further method of verifying an optical proximity correction (OPC) rule set includes collecting post-integration image data from a post-integration structure, generating a post-integration OPC model using the post-integration image data, and performing optical rule checking (ORC) on the optical proximity correction (OPC) rule set using the post-integration OPC model to identify post-integration weak points within the structure.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
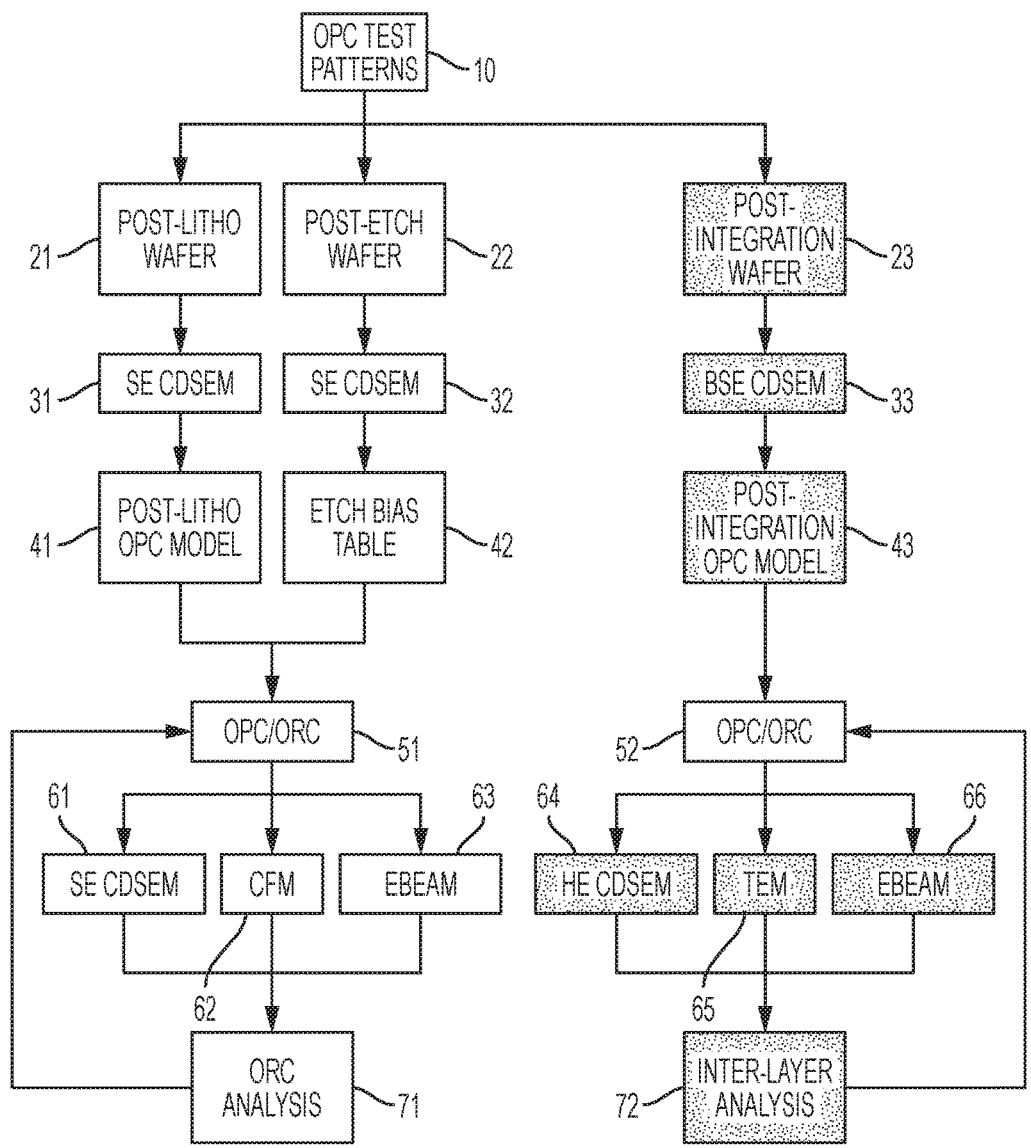
FIG. 1 is a flow chart of an OPC/ORC methodology according to various embodiments.

Reference will now be made in greater detail to various embodiments of the subject matter of the present application, some embodiments of which are illustrated in the accompanying drawings. The same reference numerals will be used throughout the drawings to refer to the same or similar parts.

Disclosed is a method where post-integration constraints are incorporated into a model-based optical proximity correction (OPC) software tool for use in an optical lithography system to provide accurate weak point prediction in a photomask for IC manufacture.

As will be appreciated, in the production of an integrated circuit (IC) device, computer-aided design (CAD) tools are used to generate an IC schematic or design, which can include an assemblage of various structures that are intended to perform a desired function. The IC device schematic is transformed into a physical representation or layout, which is then transferred onto or into a semiconductor substrate. In particular embodiments, computer-aided design (CAD) tools render the various circuit elements into discrete shapes, which are embodied in the final, physical device. These shapes define the individual elements of a circuit, such as metal interconnects, source/drain regions, gate electrodes, etc. The IC device can be any type of circuit, such as a signal processor, static or dynamic random access memory, microcontroller or system-on-chip device.

The software programs used by the CAD systems to produce layout representations are typically structured to operate under a set of pre-established design rules in order to produce a functional circuit. The design rules are, at least in part, determined by the manufacturability or patternability of a given layout, which may derive from limitations associated with design as well as processing. For instance, design rules may define the space tolerances between adjacent structures or elements subject to a given lithography processing window.

Provided with a circuit layout, a photolithography process is used to transfer the desired circuit pattern onto a semiconductor substrate to achieve an overall desired circuit performance. The desired circuit patterns are represented as opaque or transparent regions on a template such as a photomask or reticle.

Photolithography typically involves forming a layer of photoresist on the surface of the semiconductor substrate (or on one or more layers provided thereon). In certain embodiments, the photomask is placed over the substrate between a source of radiation and an optical lens system. The radiation source may output visible or ultraviolet radiation, for example. The optical lens system may form part of a stepper or scanner apparatus.

When radiation from the source is directed onto the mask, it is focused by the optical lens system to generate an image on the substrate that is representative of the pattern on the photomask. Radiation that passes through the transparent regions of the mask exposes the underlying photoresist layer, while remaining portions of the photoresist layer are unexposed. The exposed photoresist can then be developed, and the reticle pattern realized in the layer of the photoresist. The patterned photoresist can be used as a masking layer for etching exposed regions of the substrate.

Inspection or experimental testing of the devices can be performed at various stages of the manufacturing process to verify that the reproduced features and structures are within specification limits. Associated metrology may include imaging and measuring the features and structures on the substrate, such as by obtaining scanning electron microscopy (SEM) images of various regions, acquiring critical dimension (CD) measurements of particular structures, and/or acquiring performance data such as resistivity or loss measurements.

In accordance with various embodiments, optical proximity correction (OPC) algorithms pre-correct shapes formed on a photomask by segmenting the shape edges and shifting the position of the segments by minor amounts. OPC software emulates the physical and optical effects that are principally responsible for the non-fidelity of mask shapes printed on the substrate.

In various embodiments, optical proximity correction involves running a computer simulation that takes an initial data set including information related to the desired pattern or layout, and generating an amended data set by manipulating the initial data set to compensate for errors between a transferred pattern and a desired pattern. A disconnect between the reticle pattern and the realized pattern may be due to one or more of process variability, geometric effects such as loading or shadowing effects, and etching phenomena.

That is, optical proximity correction is commonly used to compensate for image errors resulting from diffraction or process effects. The diffraction of light in optical lithography systems, for instance, is an obstacle to feature size scaling. The implementation of OPC addresses at least in part the limitations of light to maintain edge placement (e.g., patterned or etched structure) fidelity of an original design after processing. OPC endeavors to achieve a mask design that generates a printed structure that matches the design intent, including feature size and placement. An OPC rule set can be applied to layout data to generate a corrected layout data set.

During photolithography, projected images may appear with irregularities such as line widths that are narrower or wider than designed. Other distortions such as rounded corners may be driven by the resolution of the optical imaging tool. Such distortions, if not corrected, may significantly alter the performance and reliability of the final device. Optical proximity correction addresses these potential errors by moving edges or adding extra features to the pattern written on a photomask. The OPC objective function incorporates the process variation information.

Optical proximity correction may be rule-based using pre-computed data based on, for example, the width and spacing between features, or model-based using dynamic calculations to simulate the final pattern and thereby define an initial pattern that produces the intended solution.

A computer-implemented OPC process can involve iteratively refining the layout data set using, for example, an edge placement error (EPE) value as a standard for the corrective process. In such a process, layout data are revised based on the rule(s) and/or model(s) in order to achieve an acceptable difference between the desired and actual placement of features and elements within the pattern. Thus, exemplary methods automatically deform existing mask shapes to achieve the target dimensions on the wafer.

Simulation of a layout represented by the corrected layout data set can include performing optical rule checking (ORC). Optical rule checking (ORC) is used to verify the accuracy of OPC, i.e., whether the adjusted patterns produce the desired results. In certain embodiments, the OPC simulation tool can perform ORC in order to identify errors within the layout model, i.e., regions where one or more layout structures or features have edge placement errors. Edge placement error values can be calculated, statistically analyzed, and used to perform a given iteration of the OPC simulation.

According to various embodiments, optical proximity correction (OPC) and associated optical rule checking (ORC) are used in conjunction with a contact metallization process to produce the via- or trench-defining photomask. In various embodiments, OPC test patterns are generated to simulate various stages of manufacture, including post-lithography, post-etch and post-integration (i.e., following metallization and chemical mechanical polishing). In particular embodiments, disclosed is a method to modify a mask produced by OPC to include post-integration awareness. Such modeling provides an additional constraint that may represent metal contours at respective top and bottom surfaces of adjacent structures in order to more accurately assess and resolve the risk of electrical shorts (e.g., interlayer bridging) between such structures. As will be appreciated, the disclosed method is an improvement to merely relying on a post-etch contour of metal features or a cropped target layer of a via or trench to identify errors in the OPC model.

According to various embodiments, a method of creating an optical proximity correction (OPC) model and assessing the model through optical rule checking (ORC) includes the introduction of post-integration, i.e., post-metallization data. Scanning electron microscope images from metallized structures as well as other metrology tools are used during development and verification of the model to accurately predict post-integration behavior.

Referring to FIG. 1, a flow chart depicts the successive development and assessment of OPC models (i.e., test patterns 10) at various stages of manufacture. For a given structure, OPC may model the behavior of the photoresist during lithography (post-litho wafer 21), the geometry of etched features (post-etch wafer 22), and the structure of metallized layers, e.g., following metal deposition within etched features and chemical mechanical polishing (post-integration wafer 23).

As shown schematically in the flow chart, topographical data from secondary electron critical dimension scanning electron microscopy (SE CDSEM) 31, 32 may be used to develop a post-lithographic 41 as well as a post-etch OPC model, including the creation of an etch bias table 42, while backscattered critical dimension scanning electron microscope (BSE CDSEM) data 33 may be used to develop a post-integration model 43. The backscattered critical dimension scanning electron microscope (BSE CDSEM) data may include compositional images. The SEM data is used to create the OPC models 51, 52.

Thus, in certain embodiments, secondary and backscattered electron imaging using a scanning electron microscope (SEM) may be used to evaluate the device structure and provide feedback to the model. Secondary electron (SE) imaging provides good resolution and detail in terms of surface morphology. Backscattered electron (BSE) imaging, on the other hand, which leverages the more effective scattering of electrons by heavier nuclei than lighter nuclei, provides less detail in terms of topography and surface texture, but accentuates differences in atomic number and can provide highly-contrasted images showing metal and dielectric layers within a structure, for example.

In post-etch OPC modeling, for example, the disclosed method models a critical dimension (CD) difference between a measured CD value of a feature after the photolithography process and a measured CD value of the feature after the etch process. The difference may result from a non-uniform and non-linear etch bias (hereinafter "etch bias") during processing.

Referring still to FIG. 1, after generating a model, one or more metrology tools may be used to verify the OPC results following ORC, as seen with reference to blocks 51, 52. For the post-lithography and post-etch OPC models 41, 42, SE CDSEM 61, contamination-free manufacturing (CFM) scanning tools 62, and e-beam spectroscopy techniques 63 may be used to verify the accuracy of the models. For the post-integration OPC model 43, high energy CDSEM 64, transmission electron microscopy (TEM) 65 and e-beam techniques 66 may be used. The ORC analysis 71 or interlayer analysis 72 may continue with additional metrology.

In various embodiments, the disclosed OPC/ORC methodology is applied to the formation of conductive features on a substrate. As will be appreciated by those skilled in the art, plural devices formed on a semiconductor substrate are commonly interconnected. Interconnects are provided by forming contacts and conductive lines, typically within a layer of dielectric material using, for example, damascene techniques. The presently-disclosed approach may be used to improve the design and formation of interconnect features during device manufacture.

Figure 2:
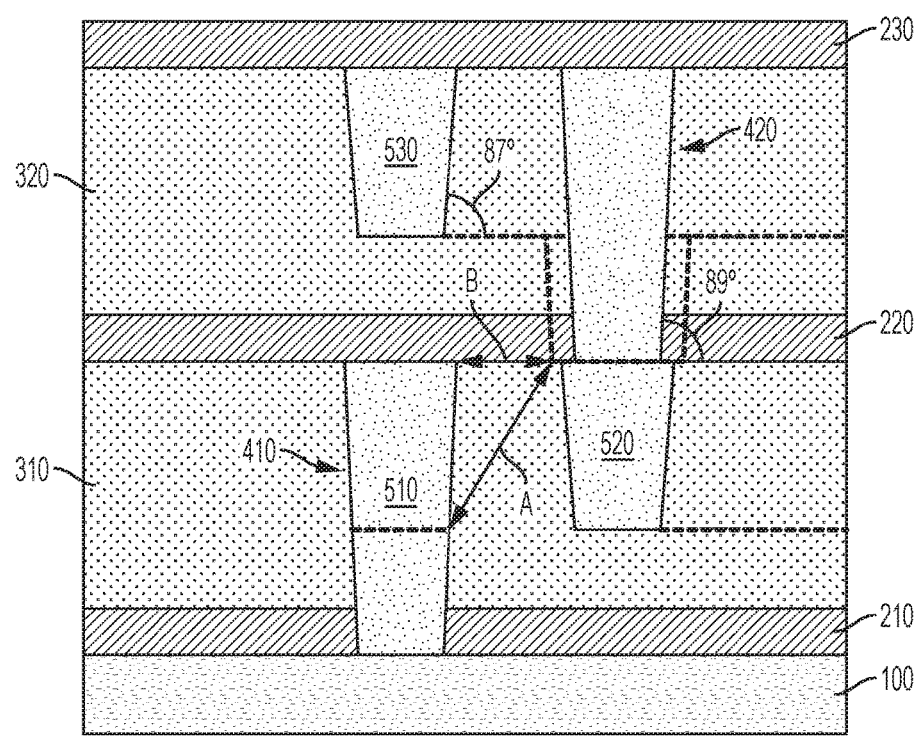
FIG. 2 is a cross-sectional schematic diagram of an exemplary metallization structure.

Referring to FIG. 2, illustrated is an integration process and a resulting metallization structure, which may be implemented as a back end of the line (BEOL) module for interconnecting metal wires. The simplified structure is formed over a semiconductor substrate 100, which may be a silicon wafer. In lieu of silicon, the substrate may comprise other materials and/or structures. For instance, the substrate 100 may be a germanium wafer or a composite substrate such as a semiconductor-on-insulator (SOI) substrate. The substrate may include active regions (not shown) upon which devices may be formed.

A metallization structure including intra-level wiring and inter-level vias may be used to interconnect various regions or elements of the device. Dielectric capping layers 210, 220 and 230 are formed are various levels of the structure. First capping layer 210 is formed directly over a top surface of the substrate 100. Second and third capping layers 220, 230 are formed respectively over first and second dielectric layers 310, 320. Capping layers 210, 220, 230 may comprise silicon nitride, for example.

Suitable dielectric materials for the first and second dielectric layers 310, 320 include oxides, nitrides and oxynitrides, such as silicon dioxide, silicon nitride, silicon oxynitride, and low dielectric constant (low-k) materials such as amorphous carbon, SiOC, SiOCN and SiBCN, as well as other low-k dielectric materials. A "low-k" material has a dielectric constant less than that of silicon dioxide. As will be appreciated, the capping layers and the dielectric layers may be formed by chemical vapor deposition or atomic layer deposition, although other layer-forming techniques may be implemented.

As used herein, the compounds silicon nitride and silicon dioxide have compositions that are nominally represented as $Si_3N_4$ and $SiO_2$, respectively. The terms silicon nitride and silicon dioxide, refer to not only these stoichiometric compositions, however, but also to nitride and oxide compositions that deviate from the stoichiometric compositions.

A via etch process, such as a reactive ion etch (RIE) process is used in conjunction with conventional photolithography and metal deposition processes to define contact vias 410, 420, which extend entirely through a respective dielectric layer 310, 320, and metal lines (i.e., trenches) 510, 520, 530, which extend partially through a respective dielectric layer 310, 320.

The via and trench etch processes may be directional (anisotropic) etch processes where the resulting via and trench sidewalls are substantially vertical, i.e., orthogonal to a major surface of the substrate 100. In certain embodiments, sidewalls of the vias and metal lines may be configured to have an angle with respect to horizontal of 85 to 90°, e.g., 85, 87 or 89°, including ranges between any of the foregoing values.

A conductive material is deposited within the vias and trenches, which include an upper via 420 in electrical contact with a lower metal line 520. In various embodiments, the conductive material may be blanket deposited using, for example, atomic layer deposition, and may comprise copper, cobalt, titanium, or tungsten, as well as alloys and compounds thereof.

Once the vias and trenches at a given level have been filled, a polishing step may be used to remove the overburden and planarize the structure. For instance, grinding or chemical mechanical polishing (CMP) may be used to planarize the structure. The dielectric layers 310, 320 may function as a CMP etch stop. In the illustrated structure, contact via 420 is formed directly over metal line 520, and laterally adjacent to metal lines 510, 530.

Referring still to FIG. 2, while upper via 420 is electrically connected to a lower metal line 520, it is the intent that upper via 420 is electrically isolated from lower metal line 510, e.g., by remaining portions of dielectric layer 310. However, as will be appreciated, the placement of the various features and/or the formation during the trench etch of tapered sidewalls may create a region (B) across which the via 420 is at risk of bridging (i.e., shorting) to the adjacent metal line 510.

Indeed, current approaches to photomask design and verification fail to consider the risk of an electrical short between the statistically relevant bottom of the upper via 420 and the laterally-adjacent top of a lower metal line 510, i.e., through region (B), and consider instead the likelihood of bridging through region (A), relying on the cropped target layer of the via and the post-etch contour of the metal. In other words, conventional approaches to verifying OPC for via and trench placement use a pair of inaccurate contours, including the location of the bottom of the upper via 420 prior to depositing metal, and the bottom of the adjacent trench opening prior to depositing metal to form metal line 510. Applicant has determined that OPC modeling and photomask fabrication based on these assumptions can result in undesired parasitic effects or an unintended electrical short between the upper via 420 and a lower metal line 510 that adversely affects device reliability and manufacturing throughput.

In accordance with embodiments of the present application, in performing a correction to via placement, the optical proximity correction (OPC) is directed to consider additional constraints, including the post-integration geometry of the lower metal line 510. Data describing the location and shape of the respective conductive features to verify the post-integration model can be obtained using one or more of high energy critical dimension scanning electron microscopy, transmission electron microscopy, and e-beam spectroscopy. In accordance with various embodiments, the proposed OPC/ORC methodology contemplates interlayer connections, and particularly post-metallization considerations.

Applicant has shown that metallization processes, including deposition and polishing, can relocate edges and change critical dimensions relative to the pre-metallization, post-etch geometry.

Based on the foregoing, each iteration of the OPC performs a simulation and determines if the via placement satisfies an edge placement error (EPE), which is a quantitative representation of the deviation of the edges of a simulated mask image with respect to the edges of the target image. Typically, EPE tolerances are expressed as geometric rules or constraints on the image shapes relative to shapes on the same physical layer. If the image does not remain within tolerance or the allowable EPE, the segment is iteratively moved forward or backward until all of the simulated image edges are located within an accepted tolerance of the location of the target image edges. Eventually, the final corrected mask layout is outputted.

As will be appreciated by those skilled in the art, embodiments of the present disclosure are used in optical lithography to correct for distortions on a photomask having patterns of circuit design features in order to achieve an accurate projection of the patterns onto a photoresist coated substrate. Model-based OPC is performed in which post-integration data are used to construct a post-integration OPC model. Using the post-integration OPC model, ORC is performed to identify post-integration weak points. The method has been demonstrated to improve patterning quality, and correspondingly enhance manufacturing yield as well as device performance and reliability by addressing a known failure mechanism.

Figure 3:
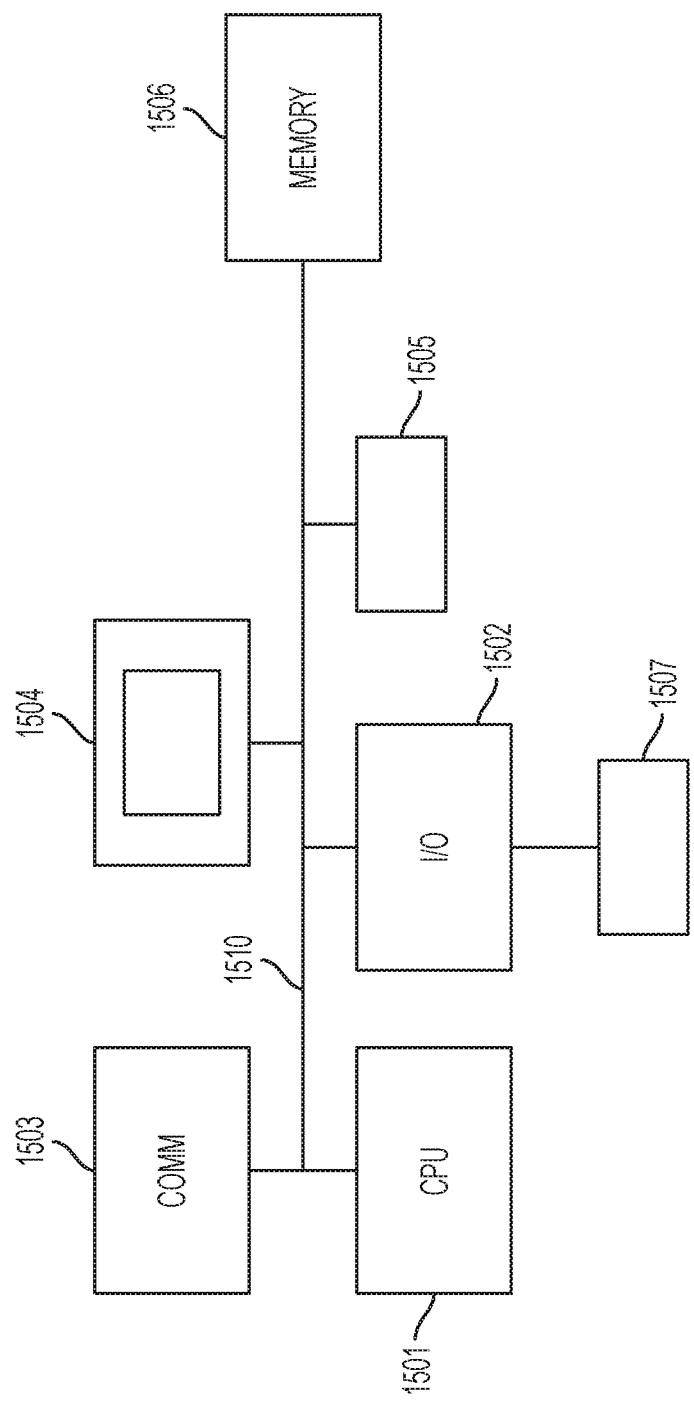
FIG. 3 is a schematic illustration of a computer system and computer program product adapted to perform the presently-disclosed method.

Embodiments of present method may be implemented in a digital computer, or computer system, as shown schematically in FIG. 3. Components of an exemplary computer or computer system include a central processing unit (CPU) 1501, an input/output (I/O) device 1502 (such as a keyboard, mouse, compact disk (CD) drive, etc.), a controller 1503, a display device 1504, a storage device 1505 capable of reading and/or writing computer readable code, and memory 1506. The foregoing are typically connected, e.g., by a bus or a communications network 1510.

Various embodiments may be implemented as a computer program product stored on a computer readable medium 1507, such as a tape or CD, or on the storage device 1505. The computer program product contains instructions to implement the method on a computer.

Disclosed is a model-based methodology for post-integration aware OPC. The method allows ORC to comprehend areas at risk of metal-to-metal bridging. Without wishing to be bound by theory, it is believed that the post-integration OPC model enables ORC to accurately identify weak points within the design, which can be used to improve patterning, etching and filling of the vias, improve manufacturing yield and beneficially impact device performance and reliability.

As used herein, the singular forms "a," "an" and "the" include plural referents unless the context clearly dictates otherwise. Thus, for example, reference to a "via" includes examples having two or more such "vias" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a via that comprises tungsten include embodiments where the via consists essentially of tungsten and embodiments where the via consists of tungsten.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of verifying an optical proximity correction (OPC) rule set, comprising:
    collecting critical dimension scanning electron microscope (CDSEM) data from a post-integration structure, wherein the post-integration structure includes:
        a first metal level having a first conductive structure, and
        a second metal level above the first metal level and having a second conductive structure horizontally separated from the first conductive structure;
    constructing a post-integration OPC model using the post-integration CDSEM data;
    performing optical rule checking (ORC) on the optical proximity correction (OPC) rule set using the post-integration OPC model to identify post-integration weak points within the structure, wherein at least one of the post-integration weak points includes a bridge defect between the first conductive structure and the second conductive structure;

verifying the post-integration weak points to create a verified OPC rule set; and producing a photomask using the verified OPC rule set.

2. The method of claim 1, wherein the CDSEM data comprises a backscattered critical dimension scanning electron microscope (BSE CDSEM) compositional image including the first metal level and the second metal level.

3. The method of claim 1, wherein the post-integration CDSEM data corresponds to a metal trench pattern.

4. The method of claim 1, wherein the first conductive structure includes a lower metal wire, and wherein the second conductive structure includes an upper via.

5. The method of claim 4, wherein verifying the post-integration weak points comprises measuring a distance between a top surface of the lower metal wire and a bottom surface of the upper via within the structure.

6. The method of claim 5, wherein the measured distance includes a horizontal component and a vertical component.

7. The method of claim 1, wherein verifying the post-integration weak points utilizes at least one metrology technique selected from a group consisting of high energy critical dimension scanning electron microscopy, transmission electron microscopy and electron beam spectroscopy.

8. A method of verifying an optical proximity correction (OPC) rule set, comprising:

collecting image data from a post-integration structure, wherein the post-integration structure includes:
a first metal level having a first conductive structure, and
a second metal level above the first metal level and having a second conductive structure horizontally separated from the first conductive structure;

generating a post-integration OPC model using the image data of the post-integration structure;

performing optical rule checking (ORC) on the optical proximity correction (OPC) rule set using the post-integration OPC model to identify post-integration weak points within the structure, wherein at least one of the post-integration weak points includes a bridging region between the first conductive structure and the second conductive structure;

modifying the OPC rule set to correct for the identified post-integration weak points; and producing a photomask using the modified OPC rule set.

9. The method of claim 8, wherein the image data of the post-integration structure comprises a backscattered critical dimension scanning electron microscope (BSE CDSEM) image.

10. The method of claim 8, wherein the image data of the post-integration structure corresponds to a metal trench pattern.

11. The method of claim 8, wherein the first conductive structure includes a lower metal wire, and wherein the second conductive structure includes an upper via.

12. The method of claim 11, further comprising verifying the post-integration weak points.

13. The method of claim 12, wherein verifying the post-integration weak points comprises measuring a distance between a top surface of the lower metal wire and a bottom surface of the upper via within the structure.

14. The method of claim 13, wherein the measured distance includes a horizontal component and a vertical component.

15. The method of claim 12, wherein verifying the post-integration weak points utilizes at least one metrology technique selected from a group consisting of high energy critical dimension scanning electron microscopy, transmission electron microscopy and electron beam spectroscopy.

* * * * *